(12) United States Patent
Park (10) Patent No.: US 7,374,975 B2
(45) Date of Patent: May 20, 2008

(54) METHOD OF FABRICATING A TRANSISTOR

(75) Inventor: Jeong-Ho Park, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/615,791

(22) Filed: Dec. 22, 2006

(65) Prior Publication Data

US 2007/0158735 A1  Jul. 12, 2007

(30) Foreign Application Priority Data

Dec. 29, 2005  (KR) .................. 10-2005-0133429

(51) Int. Cl.
*H01L 21/8232* (2006.01)
*H01L 21/335* (2006.01)
*H01L 21/84* (2006.01)
*H01L 21/8238* (2006.01)

(52) U.S. Cl. .............. 438/142; 438/151; 438/154; 438/199; 438/300; 438/302; 257/315; 257/E21.427; 257/E21.703

(58) Field of Classification Search .......... 438/142, 438/151, 154, 199, 300, 302; 257/315, E21.427, 257/E21.703
See application file for complete search history.

(56) References Cited

U.S. PATENT DOCUMENTS

| 2005/0139911 A1* | 6/2005 | Kim ................... 257/336 |
| 2005/0142730 A1* | 6/2005 | Kim ................... 438/232 |
| 2006/0263985 A1* | 11/2006 | Kang et al. .......... 438/275 |

* cited by examiner

*Primary Examiner*—Michael Lebentritt
*Assistant Examiner*—Mohsen Ahmadi
(74) *Attorney, Agent, or Firm*—Sherr & Nourse, PLLC (57) ABSTRACT

A method of forming a transistor reduces leakage current and hot carrier effects, and therefore improves current performance. The method of forming a transistor includes selectively etching the semiconductor substrate to form a substrate protrusion and expose a buried source/drain implant region. A gate insulating layer covers the substrate protrusion and the first source/drain region. A gate conductor layer is selectively etched to form a gate pattern covering the sidewalls of the substrate protrusion and a portion of the semiconductor substrate adjacent to the sidewalls of the substrate protrusion. A second source/drain region is stacked over the top of the substrate protrusion. Contacts connected to the gate pattern and the first and second source/drain regions.

8 Claims, 9 Drawing Sheets

METHOD OF FABRICATING A TRANSISTOR

The present application claims priority under 35 U.S.C. 119 and 35 U.S.C. 365 to Korean Patent Application No. 10-2005-0133429 (filed on Dec. 29, 2005), which is hereby incorporated by reference in its entirety.

BACKGROUND

In a planar transistor, source and drain regions may be formed on the left and right sides of a central gate. In this transistor structure, when current flows from the source to the drain, leakage current is generated, which flows to the semiconductor substrate. The leakage current causes an increase in power consumption. Also, a hot carrier phenomenon at the edge of the gate severely affects the reliability of the device.

Accordingly, development of a method of forming a transistor which reduces leakage current and hot carrier effects is required. Also, development of a method of forming a transistor device which improves current performance in the same area is required.

SUMMARY

Embodiments relate to a method of forming a vertical channel type transistor.

Embodiments relate to a method of forming a transistor which reduces leakage current and hot carrier effects, and therefore improves current performance in a limited area. According to embodiments, a method of forming a transistor includes implanting ions into a semiconductor substrate to form a first source/drain region; selectively etching the semiconductor substrate to form a substrate protrusion having a top and sidewalls; forming a gate insulating layer covering the substrate protrusion and the first source/drain region; depositing a gate conductor layer over the gate insulating layer; selectively etching the gate conductor layer to form a gate pattern covering the sidewalls of the substrate protrusion and covering a portion of the semiconductor substrate adjacent to the sidewalls of the substrate protrusion; forming a second source/drain region stacked over the top of the substrate protrusion using implanted ions; and forming a contacts connected to the gate pattern and the first and second source/drain regions.

The first source/drain region may be formed in the semiconductor substrate at a predetermined depth from the surface of the semiconductor substrate, and the substrate protrusion is etched to expose the first source/drain region.

A channel threshold voltage adjust implant may be performed on the substrate protrusion. The channel threshold voltage adjust implant is performed using a tilt between 30 and 60° from a plane of a surface of the substrate.

A sacrificial oxide layer may be formed by oxidizing surfaces of the substrate protrusion and the recessed semiconductor substrate before the channel threshold voltage adjust implant; the sacrificial oxide layer is removed after the channel threshold voltage adjust implant.

The gate pattern may be formed by forming a mask over the gate conductor layer and dry etching the gate conductor layer exposed by the mask using the gate insulating layer as an etch stopper. The gate pattern may extend over a portion of the top of the substrate protrusion. The channel region of the transistor formed by this method is oriented vertically in the substrate protrusion.

According to embodiments, since current flows in the vertical direction, it is possible to reduce leakage current and hot carrier effects so that it is possible to improve current performance in a limited area.

DETAILED DESCRIPTION

Embodiments will be described in detail with reference to the attached drawings.

FIGS. 1 to 9 are sectional views schematically illustrating a method of forming a transistor according to embodiments.

Figure 1:
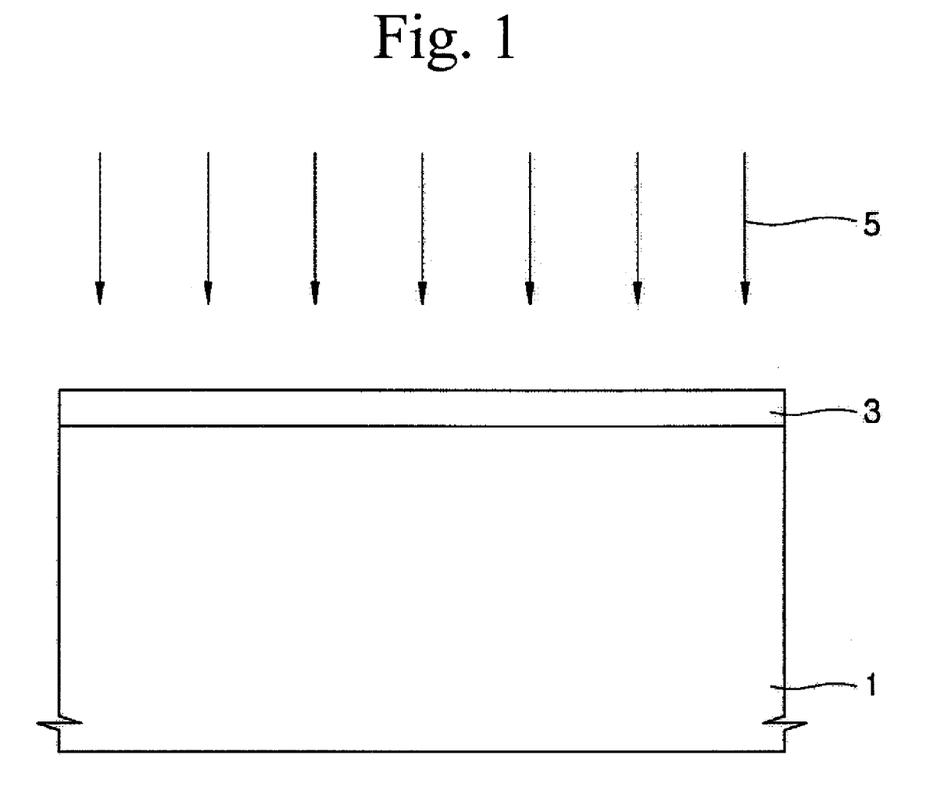
FIGS. 1 to 9 are sectional views schematically illustrating a method of forming a transistor according to embodiments.

Referring to FIG. 1, after depositing a first insulating layer 3 over a silicon (Si) semiconductor substrate 1, a first source/drain implant 5 is performed into the semiconductor substrate 1 using an ion implant method.

Figure 2:
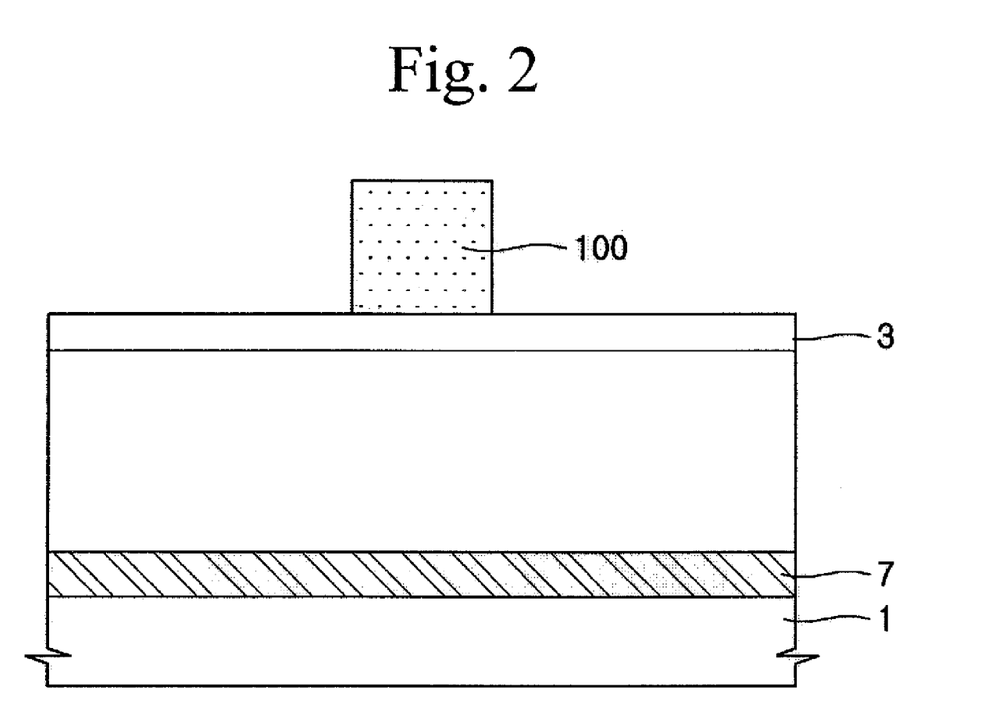

Referring to FIG. 2, a first mask 100 is formed. The first mask 100 may be formed of a first photoresist layer. The first source/drain region 7 is illustrated on the substrate 1 at a predetermined depth.

Figure 3:
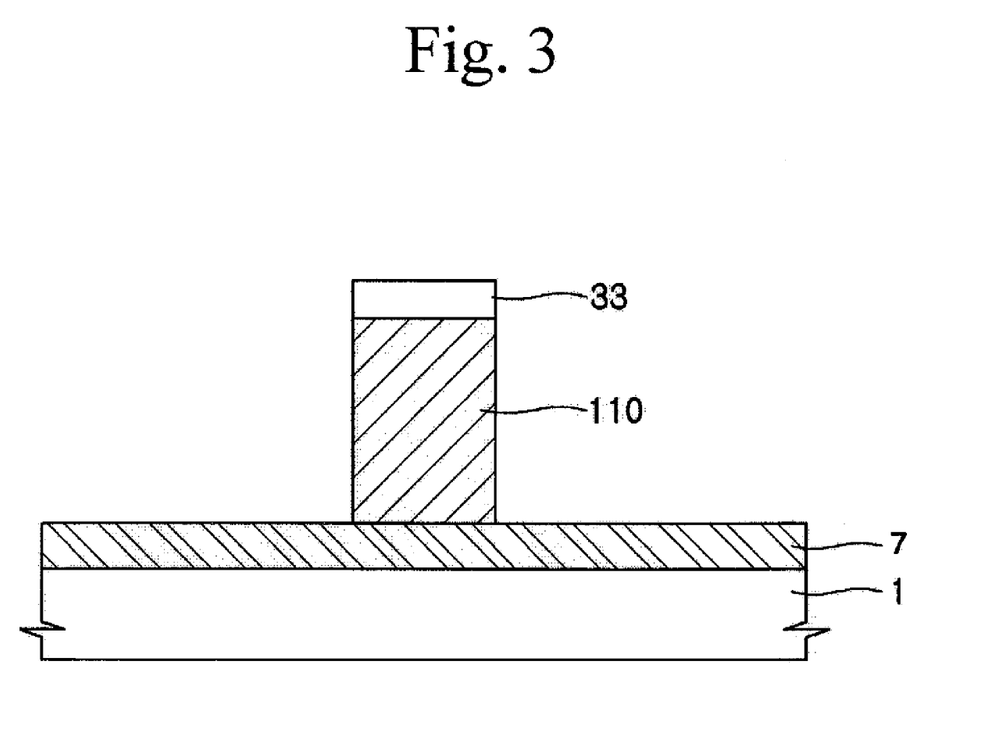

Referring to FIG. 3, the exposed parts of the first insulating layer 3 and the substrate 1 are etched by a dry etching method using the first mask 100 to expose the first source/drain region 7. The dry etching process forms a substrate protrusion 110 that protrudes above the substrate 1. A first insulating layer pattern 33 remains stacked over the substrate protrusion 110. The first mask 100 and the first insulating layer pattern 33 are removed.

Figure 4:
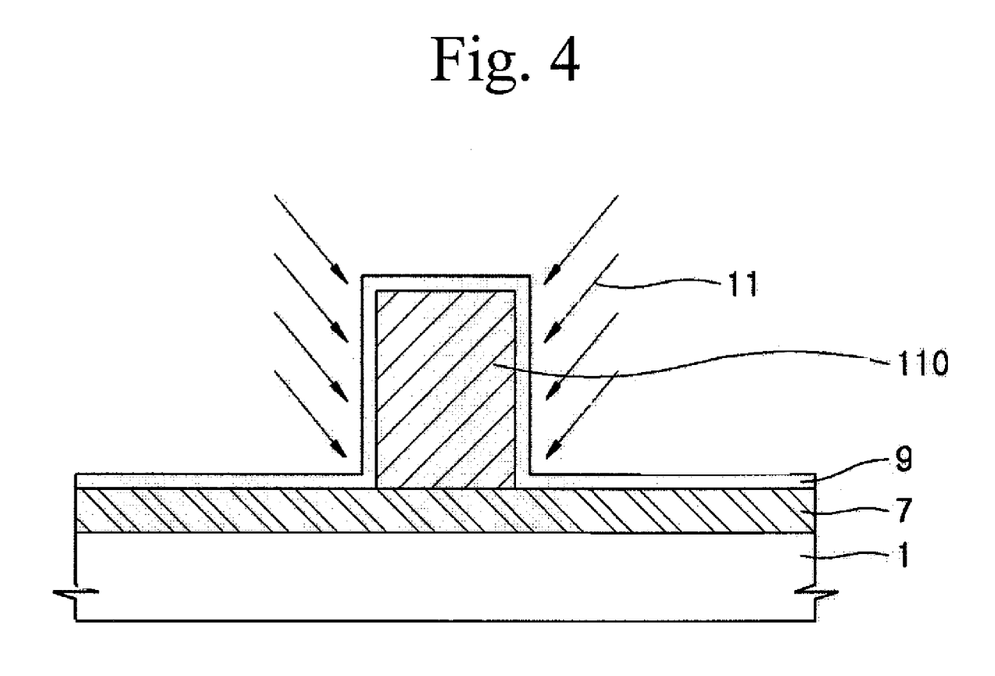

Referring to FIG. 4, after forming a sacrificial oxide layer 9 using an oxidation method, a channel threshold voltage adjust implant 11 is performed using an ion implant method. The channel threshold voltage adjust implant can be performed using a tilt of 30 to 60°. The sacrificial oxide layer 9 functions as a buffer layer during the channel threshold voltage adjust implant 11. Also, the sacrificial oxide layer 9 can heal the damage to the surface of a channel region, that is, the surface of the substrate protrusion 110.

Figure 5:
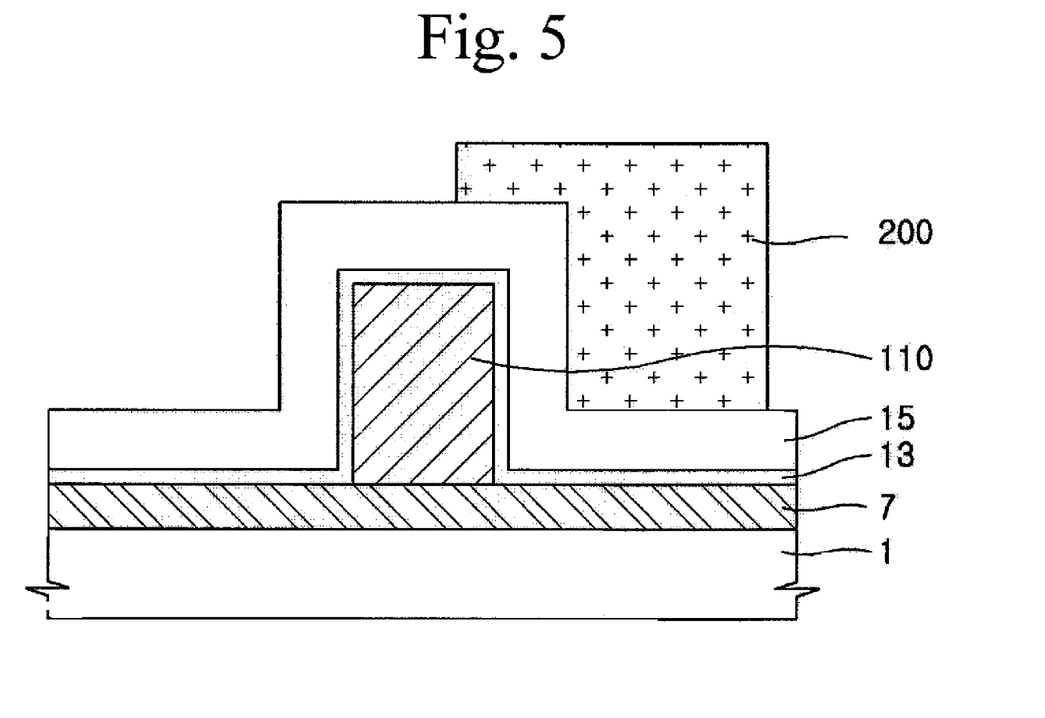

Referring to FIG. 5, after completely removing the sacrificial oxide layer 9 using a wet etch method, a gate insulating layer 13 is formed. Then, after depositing a gate conductor 15, for example, polysilicon, a second mask 200 is formed. The second mask 200 may partially overlap the top surface of the substrate protrusion 110.

Figure 6:
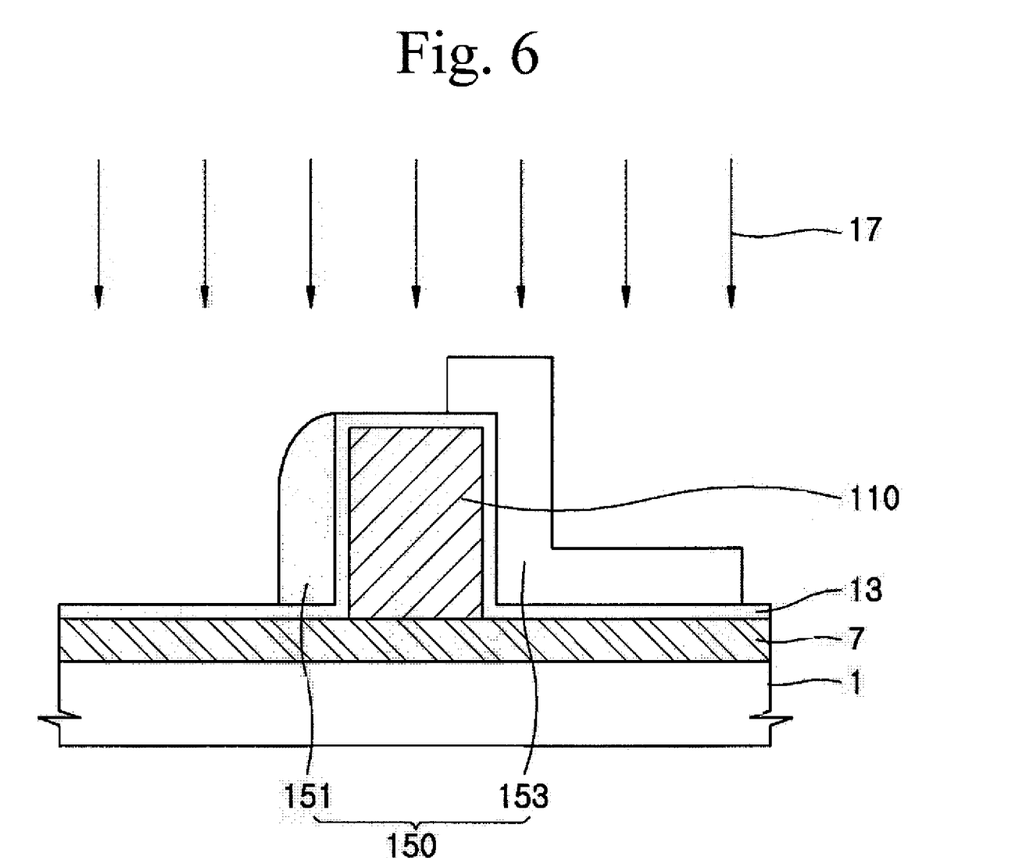

Referring to FIG. 6, after the gate conductor 15 is patterned by a dry etching method using the second mask 200 to form a gate pattern 150, the second mask 200 is removed. The gate insulating layer 13 is used as an etch stopper in a process of etching the gate conductor 15. Therefore, a first gate pattern 151 in the form of a spacer is formed over one side wall of the substrate protrusion 110. A second gate pattern 153 is formed over the other side wall of substrate protrusion 110. The second gate pattern 153 also extends to overlap the first source/drain region 7. The second gate pattern 153 further extends over a portion of the top surface of the substrate protrusion 110. A second source/drain implant 17 is performed using an ion implant method. A second source/drain region 19, shown in FIG. 7, is formed by the second source/drain implant 17.

Figure 7:
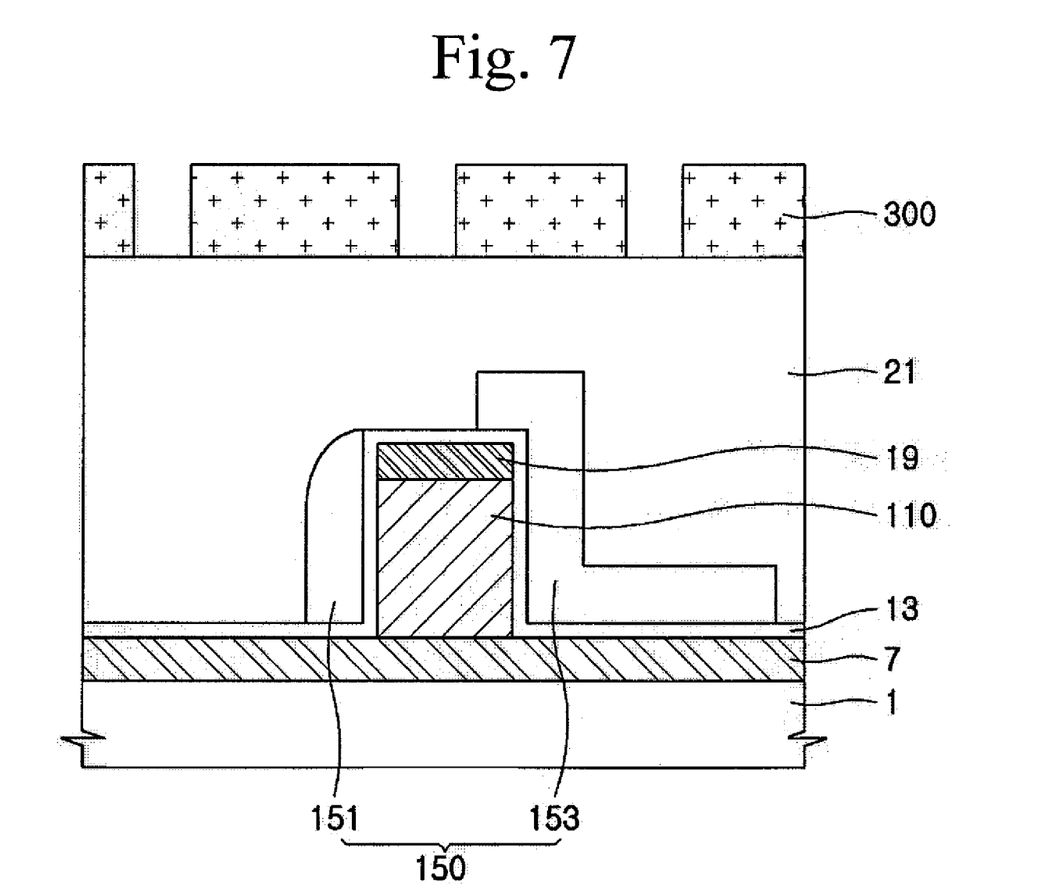

Referring to FIG. 7, after depositing an interlayer insulating layer 21, a third mask 300 is formed. The third mask 300 is exposed and developed to form a contact hole pattern.

Figure 8:
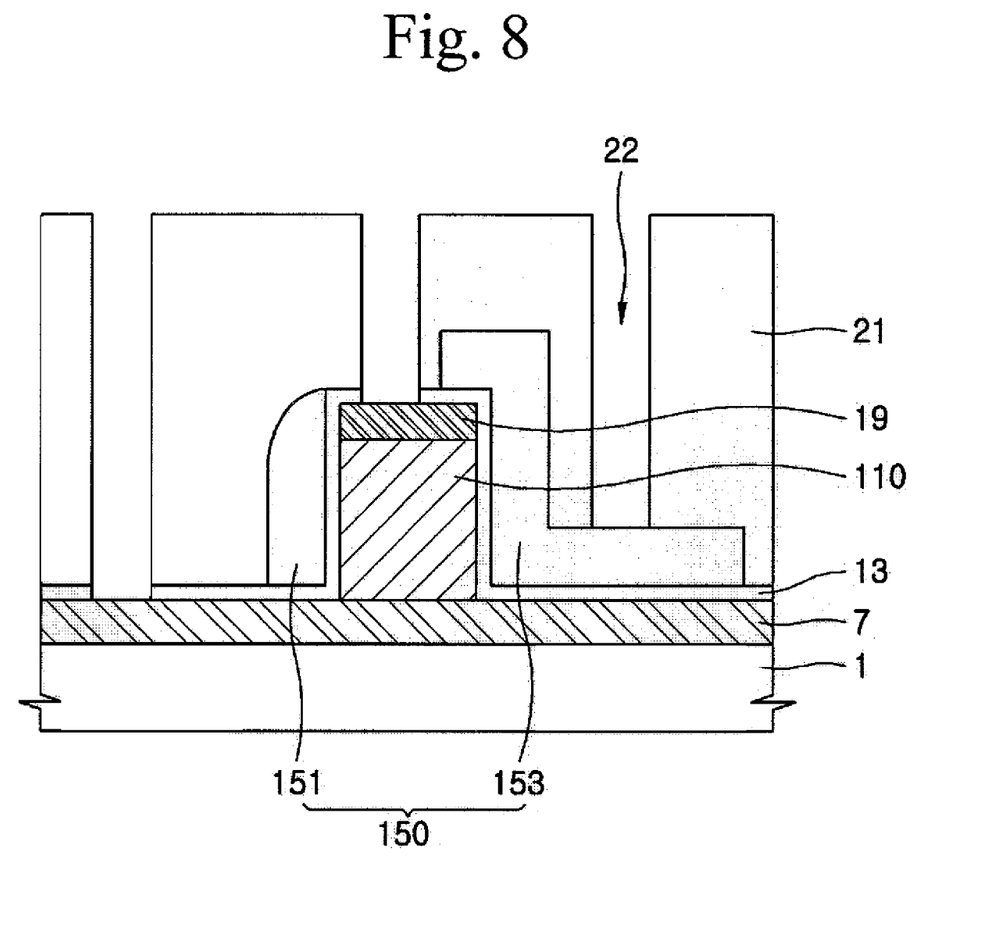

Referring to FIG. 8, the interlayer insulating layer 21 is selectively etched by a dry etching method using the third mask 300 to form a contact holes 22. Then, the third mask 300 is removed. The contact holes 22 are aligned with the first and second source/drain regions 7 and 19 and the second gate pattern 153.

Figure 9:
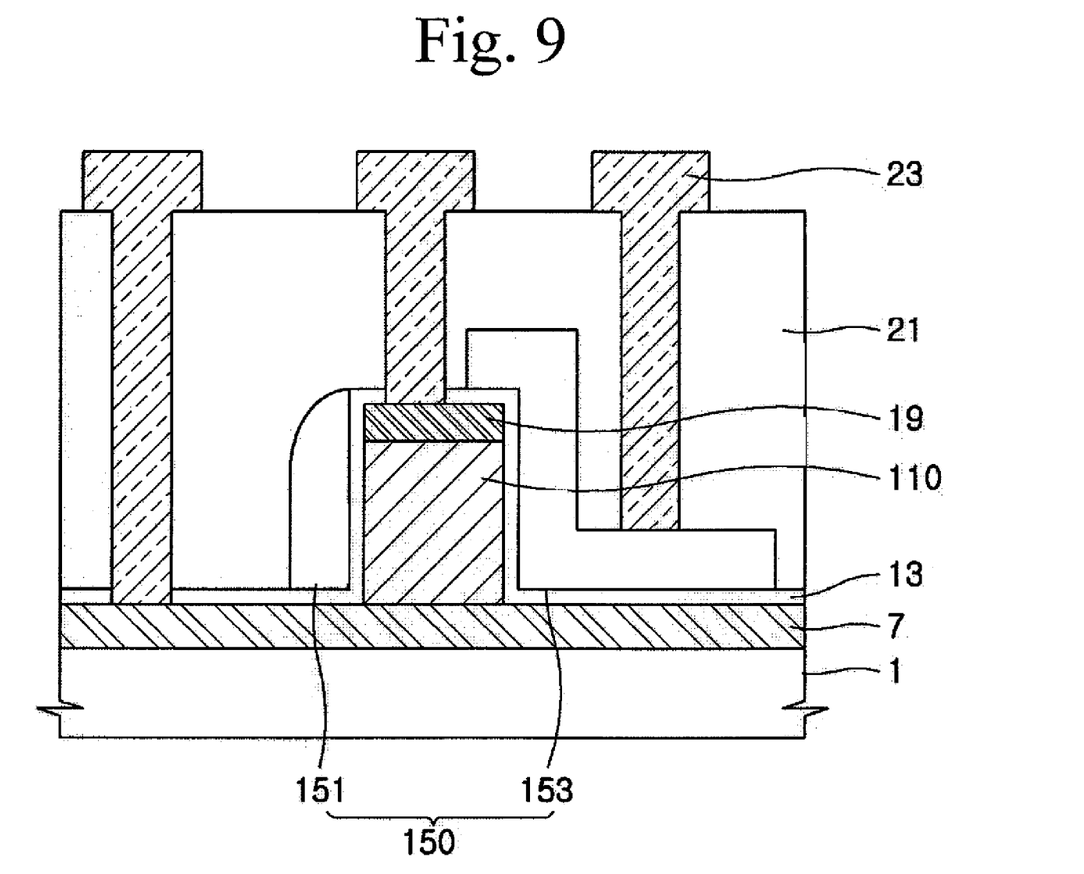

Referring to FIG. 9, a second conductor layer electrically connected to the first and second source/drain regions 7 and 19 and the second gate pattern 153 is deposited and patterned to form connection contacts 23. Here, the second gate pattern 153 is actually used as the gate of the transistor. Therefore, the channel region of the transistor is oriented vertically in the substrate protrusion 110. The second gate pattern 153 is actually formed to surround the channel region. Therefore, a vertical transistor structure is realized.

Embodiments relate to a method of manufacturing a vertical transistor, in which current flows in the vertical direction. This structure decreases leakage current and hot carrier effects, improves the reliability of the transistor, and thus improves high level devices and systems using the transistor.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method of forming a transistor comprising:
   implanting ions into a semiconductor substrate to form a first source/drain region;
   selectively etching the semiconductor substrate to form a substrate protrusion having a top and sidewalls;
   forming a gate insulating layer covering the substrate protrusion and the first source/drain region;
   depositing a gate conductor layer over the gate insulating layer;
   selectively etching the gate conductor layer to form a gate pattern covering the sidewalls of the substrate protrusion and covering a portion of the semiconductor substrate adjacent to the sidewalls of the substrate protrusion;
   forming a second source/drain region stacked over the top of the substrate protrusion using implanted ions; and
   forming a contacts connected to the gate pattern and the first and second source/drain regions.

2. The method of claim 1,
   wherein the first source/drain region is formed in the semiconductor substrate at a predetermined depth from the surface of the semiconductor substrate, and
   wherein the substrate protrusion is etched to expose the first source/drain region.

3. The method of claim 1, further comprising:
   performing channel threshold voltage adjust implant on the substrate protrusion.

4. The method of claim 3, wherein the channel threshold voltage adjust implant is performed using a tilt between 30 and 60° from a plane of a surface of the substrate.

5. The method of claim 3, further comprising:
   oxidizing surfaces of the substrate protrusion and the recessed semiconductor substrate to form a sacrificial oxide layer before the channel threshold voltage adjust implant; and
   removing the sacrificial oxide layer after the channel threshold voltage adjust implant.

6. The method of claim 1, wherein said forming the gate pattern comprises:
   forming a mask over the gate conductor layer; and
   dry etching the gate conductor layer exposed by the mask using the gate insulating layer as an etch stopper.

7. The method of claim 1, wherein said gate pattern extends over a portion of the top of the substrate protrusion.

8. The method of claim 1, wherein a channel region of the transistor is oriented vertically in the substrate protrusion.

* * * * *